United States Patent
Yamamoto et al.

(10) Patent No.: US 7,802,141 B2
(45) Date of Patent: Sep. 21, 2010

(54) SEMICONDUCTOR DEVICE HAVING ONE-CHIP MICROCOMPUTER AND OVER-VOLTAGE APPLICATION TESTING METHOD

(75) Inventors: Kiyoshi Yamamoto, Toyohashi (JP); Akitaka Murata, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 1618 days.

(21) Appl. No.: 11/059,667

(22) Filed: Feb. 17, 2005

(65) Prior Publication Data

US 2005/0195675 A1    Sep. 8, 2005

(30) Foreign Application Priority Data

Mar. 5, 2004    (JP) ............................. 2004-062150
Mar. 12, 2004    (JP) ............................. 2004-070667

(51) Int. Cl.
*G06F 11/00*    (2006.01)
(52) U.S. Cl. ............................ 714/30; 438/18; 324/765
(58) Field of Classification Search ................. 324/765; 438/18; 714/30
See application file for complete search history.

(56) References Cited

U.S. PATENT DOCUMENTS

| 5,548,224 | A | * | 8/1996 | Gabriel et al. | 324/765 |
| 5,656,944 | A | * | 8/1997 | Choi | 324/763 |
| 5,825,193 | A | * | 10/1998 | Nakata et al. | 324/763 |
| 5,936,910 | A | | 8/1999 | Hashimoto | |
| 5,999,007 | A | * | 12/1999 | Kimura | 324/760 |
| RE37,500 | E | * | 1/2002 | Lee | 324/765 |
| 6,353,563 | B1 | * | 3/2002 | Hii et al. | 365/201 |
| 6,550,038 | B2 | * | 4/2003 | Shirata | 716/4 |
| 6,620,639 | B1 | * | 9/2003 | Ray | 438/18 |
| 6,682,945 | B2 | | 1/2004 | Richmond, II et al. | |
| 6,732,304 | B1 | | 5/2004 | Ong | |
| 6,781,362 | B1 | * | 8/2004 | Miyashita et al. | 324/158.1 |
| 6,985,826 | B2 | * | 1/2006 | Pomaranski et al. | 702/120 |
| 7,596,726 | B2 | * | 9/2009 | Pomaranski et al. | 714/47 |
| 2003/0067318 | A1 | * | 4/2003 | Takahashi et al. | 324/765 |
| 2006/0290373 | A1 | * | 12/2006 | Takamiya et al. | 324/765 |

FOREIGN PATENT DOCUMENTS

| JP | A-H09-17832 | 1/1997 |
| JP | A-2000-111607 | 4/2000 |
| JP | A-2002-340988 | 11/2002 |
| JP | A-2003-156545 | 5/2003 |

OTHER PUBLICATIONS

Office Action dated Jun. 3, 2008 in corresponding Japanese Patent Application No. 2004-062150 (and English Translation).
Office Action dated Jun. 3, 2008 in corresponding Japanese Patent Application No. 2004-070667 (and English Translation).

* cited by examiner

*Primary Examiner*—Marc Duncan
(74) *Attorney, Agent, or Firm*—Posz Law Group, PLC

(57) ABSTRACT

A booster circuit is incorporated in a one-chip microcomputer. In a test mode, a burn-in test is performed by switching power supply systems so that a power supply voltage of 5V is supplied to a 3.3V-type circuit section that normally operates on a power supply voltage of 3.3V in an ordinary state and a boosted voltage of a 5V booster circuit is supplied to a 5V-type circuit section that normally operates on a power supply voltage of 5V in the ordinary state.

14 Claims, 7 Drawing Sheets

SEMICONDUCTOR DEVICE HAVING ONE-CHIP MICROCOMPUTER AND OVER-VOLTAGE APPLICATION TESTING METHOD

CROSS REFERENCE TO RELATED APPLICATION

This application is based on and incorporates herein by reference Japanese Patent Applications No. 2004-62150 filed on Mar. 5, 2004 and No. 2004-70667 filed on Mar. 12, 2004.

FIELD OF THE INVENTION

The present invention relates to a semiconductor device having a one-chip microcomputer and an over-voltage application testing method for a one-chip microcomputer.

A burn-in test is a kind of over-voltage application testing and is performed before product shipment when a semiconductor device such as a microcomputer is manufactured. This test is intended to reduce the initial failure rate in the field by causing the circuit to operate for a prescribed time in a state that power supply voltages higher than in an ordinary state of use are applied to it in an environment in which the temperature is higher than in the ordinary state of use. A product is rejected where a failure occurs during the testing (screening).

For example, in JP-A-9-17832, probing (probe-to-pad alignment) is performed chip by chip in a state that chips as semiconductor devices are formed on a wafer and a burn-in test is performed by applying high voltages to each chip. This method is low in usability because the probing needs to be performed on minute electrodes on each chip. Further it requires a high equipment cost because a wafer probe, other jigs, etc. are required to be highly accurate.

As for the probing, the number of chips that can be processed at one time is restricted because a necessary probe pressure cannot be secured if the number of needles exceeds a prescribed value. Since the burn-in test requires a certain time, a longer time is needed than in a case of using a burn-in test board for monolithic integrated circuits (ICs), for example, and hence the throughput is low.

SUMMARY OF THE INVENTION

An object of the present invention is therefore to provide a semiconductor device having a one-chip microcomputer that make it possible to perform an over-voltage application testing more easily and an over-voltage application testing method for a one-chip microcomputer.

According to one aspect of the present invention, in a semiconductor device having a microcomputer, a booster circuit is incorporated in the same chip as the microcomputer. Therefore, the microcomputer can boost an externally supplied power supply voltage and easily perform an over-voltage application testing using the boosted voltage by itself. Accordingly, since probing need not be performed chip by chip using a jig, the cost and time that are necessary for the over-voltage application testing can be reduced to a large extent.

According to another aspect of the present invention, in a semiconductor device, a power supply circuit for generating an operation power supply voltage to be supplied to a microcomputer chip that is mounted on the same integrated circuit substrate incorporates a testing circuit for performing a function test on elements of the microcomputer chip in a state that stress such as an over-voltage is imposed on the elements. This configuration make it unnecessary to conduct tests by performing probing on each bare chip and hence to easily perform a stress-imposed test of the microcomputer chip on microcomputer bare chips. Therefore, the cost of the stress-imposed test can be reduced to a large extent.

BRIEF DESCRIPTION OF THE DRAWINGS

The above and other objects, features and advantages of the present invention will become more apparent from the following detailed description made with reference to the accompanying drawings. In the drawings.

DESCRIPTION OF THE PREFERRED EMBODIMENTS

First Embodiment

Figure 1:
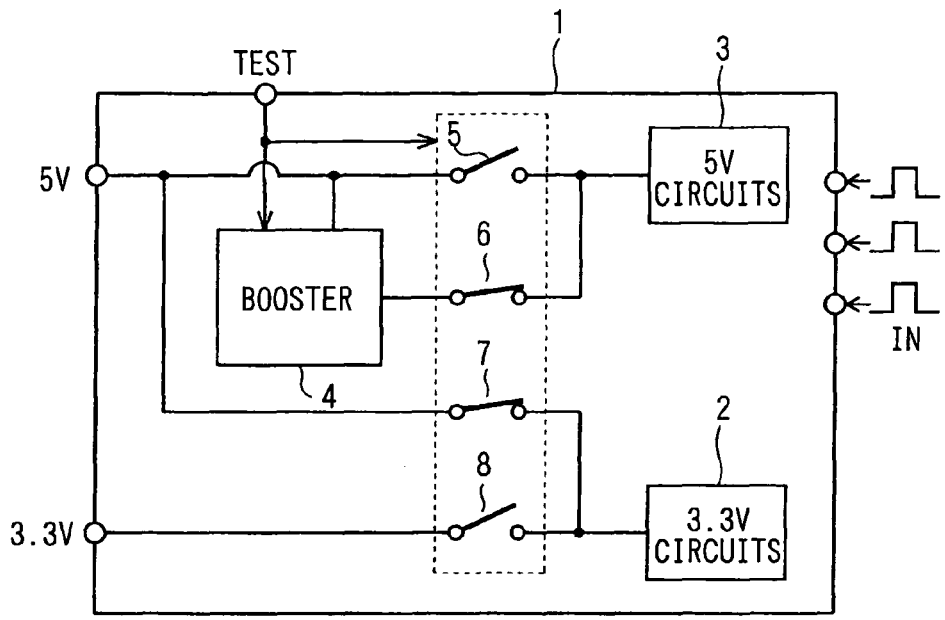
FIG. 1 is a circuit diagram showing a part of a one-chip microcomputer according to a first embodiment of the present invention.

Referring first to FIG. 1, a microcomputer 1 has a 3.3V-type circuit section 2 that operates on a power supply voltage of 3.3V and a 5V-type circuit section 3 that operates on a power supply voltage of 5V. For example, the 3.3V-type circuit section 2 is a section for performing internal processing of the microcomputer 1 and the 5V-type circuit section 3 is an external signal interface section for input and output of signals to and from peripheral circuits (not shown) that are externally connected to the microcomputer 1.

In the microcomputer 1, a booster circuit 4 is incorporated in the chip. The booster circuit 4 boosts, to 6 to 7 V, a power supply voltage of 5V that is supplied from a power supply IC that is externally connected to the microcomputer 1. The voltage of 5V is supplied to the 5V-type circuit section 3 via a switch 5 for voltage switching. The boosted voltage of the booster circuit 4 is supplied to the 5V-type circuit section 3 via a switch 6 for voltage switching 6. The voltage of 3.3V is supplied to the 3.3V-type circuit section 2 via a switch 8 for voltage switching. The voltage of 5V is also supplied to the 3.3V-type circuit section 2 via a switch 7 for voltage switching.

The switches 5-8 are switched by setting an external terminal TEST of the microcomputer 1 to a level corresponding to a test mode. That is, the switches 5 and 8 are turned on in an ordinary mode and the switches 6 and 7 are turned on in the test mode. The booster circuit 4 performs the voltage boosting operation in the case where the external terminal TEST is set to the test mode level. That is, in the test mode, the voltage of 5V is supplied to the 3.3V-type circuit section 2 and the boosted voltage of the booster circuit 4 is supplied to the 5V-type circuit section 3.

Figure 2:
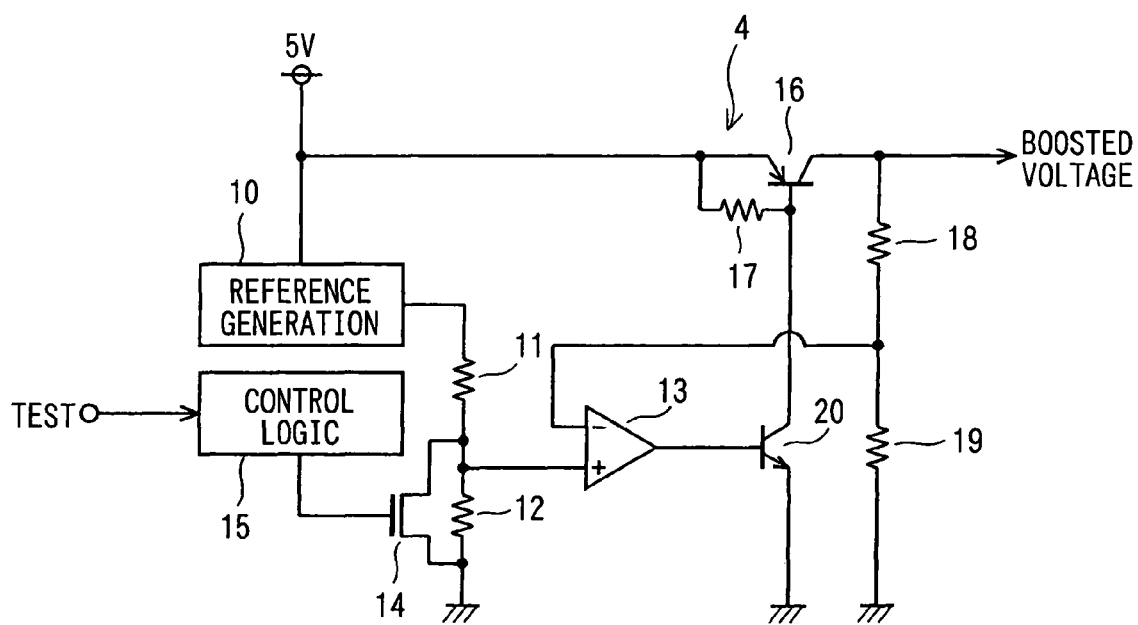
FIG. 2 is a circuit diagram showing a detailed configuration of a booster circuit provided in the first embodiment.

The booster circuit 4 is constructed as shown in FIG. 2. A reference voltage generation section 10 receives the voltage of 5V and generates a reference voltage. The output terminal of the reference voltage generation section 10 is grounded via a series circuit of resistors 11 and 12. The junction of the resistors 11 and 12 is connected to the non-inverting input terminal of an operational amplifier 13. An n-channel MOS-FET 14 is connected in parallel to the resistor 12. The gate of the FET 14 is connected to the external terminal TEST via a control logic section 15.

The emitter of a pnp transistor 16 is connected to the 5V voltage source and connected to its base via a resistor 17. The collector of the transistor 16 is grounded via a series circuit of resistors 18 and 19. The base of the transistor 16 is connected to the collector of an npn transistor 20. The junction of the resistors 18 and 19 is connected to the inverting input terminal of the operational amplifier 13. The output terminal of the operational amplifier 13 is connected to the base of the transistor 20. The emitter of the transistor 20 is grounded.

Next, the operation of this embodiment will be described. To cause the microcomputer 1 to perform an ordinary operation, the level of the external terminal TEST is set to "low," for example. In this case, the switches 5 and 8 are closed, whereby the voltage of 5V is supplied to the 5V-type circuit section 3 and the voltage of 3.3V is supplied to the 3.3V-type circuit section 2.

In the booster circuit 4, the control logic section 15 makes the gate of the FET 14 at a high level. Therefore, the FET 14 is turned on, whereby the resistor 12 is short-circuited and the non-inverting input terminal of the operational amplifier 13 is grounded.

As a result, the output signal level of the operational amplifier 13 also becomes the ground potential. The transistors 20 and 16 are turned off, whereby the output terminal of the booster circuit 4 is maintained at the ground potential via the resistors 18 and 19.

To perform a burn-in test (test mode), the level of the external terminal TEST is set to "high." In this case, the switches 6 and 7 are closed to establish the connection states shown in FIG. 1. As a result, the voltage of 5V is supplied to the 3.3V-type circuit section 2 and the boosted voltage of the booster circuit 4 is supplied to the 5V-type circuit section 3.

In this case, the booster circuit 4 performs the following boosting operation. Since the control logic section 15 turns off the FET 14, the non-inverting input terminal of the operational amplifier 13 is given a certain potential obtained by dividing the reference voltage by the resistors 11 and 12. Since the operational amplifier 13 outputs a signal whose level corresponds to the difference between the potentials of the inverting and non-inverting input terminals, the transistors 20 and 16 are turned on.

A current flows through the resistors 18 and 19, whereby the collector potential of the transistor 16, that is, the output voltage of the booster circuit 4, increases. The output voltage of the booster circuit 4 reaches equilibrium when the divided potential of the resistors 18 and 19 has increased to a prescribed value. Settings are made so that the boosted voltage becomes 6 to 7V in this state.

When the power supply systems are set in the above manner, the 3.3V-type circuit section 2 and the 5V-type circuit section 3 of the microcomputer 1 are supplied with higher power supply voltages than in the ordinary operation state.

A dynamic burn-in test is performed in such a manner that the microcomputer 1 is placed in a high-temperature environment (e.g., 125° C.) in a thermostatic chamber and signals are input to the microcomputer 1 from a testing signal output apparatus (not shown) connected to input terminals IN every time a prescribed time elapses. The test time is set at 20 hours, for example.

As described above, in this embodiment, since the booster circuit 4 is incorporated in the chip of the microcomputer 1, a burn-in test can be performed by boosting the externally supplied voltage of 5V by the microcomputer 1 itself. Therefore, it is not necessary to perform probing chip by chip using a jig, which makes it possible to reduce the cost and time required for a burn-in test to a large extent.

In the test mode, switching is made so that the voltage of 5V is supplied to the 3.3V-type circuit section 2 and the boosted voltage of the booster circuit 4 is supplied to the 5V-type circuit section 3. Therefore, even in the case where the microcomputer 1 is equipped with the 3.3V-type circuit section 2 and the 5V-type circuit section 3 that operate on the different voltages, it is not necessary to provide booster circuits for the respective circuit sections 2 and 3, which makes it possible to perform a burn-in test efficiently at a low cost. Further, since the microcomputer 1 is configured in such a manner that the booster circuit 4 operates only when a burn-in test is performed, the increase in power consumption due to the presence of the booster circuit 4 can be minimized.

Second Embodiment

Figure 3:
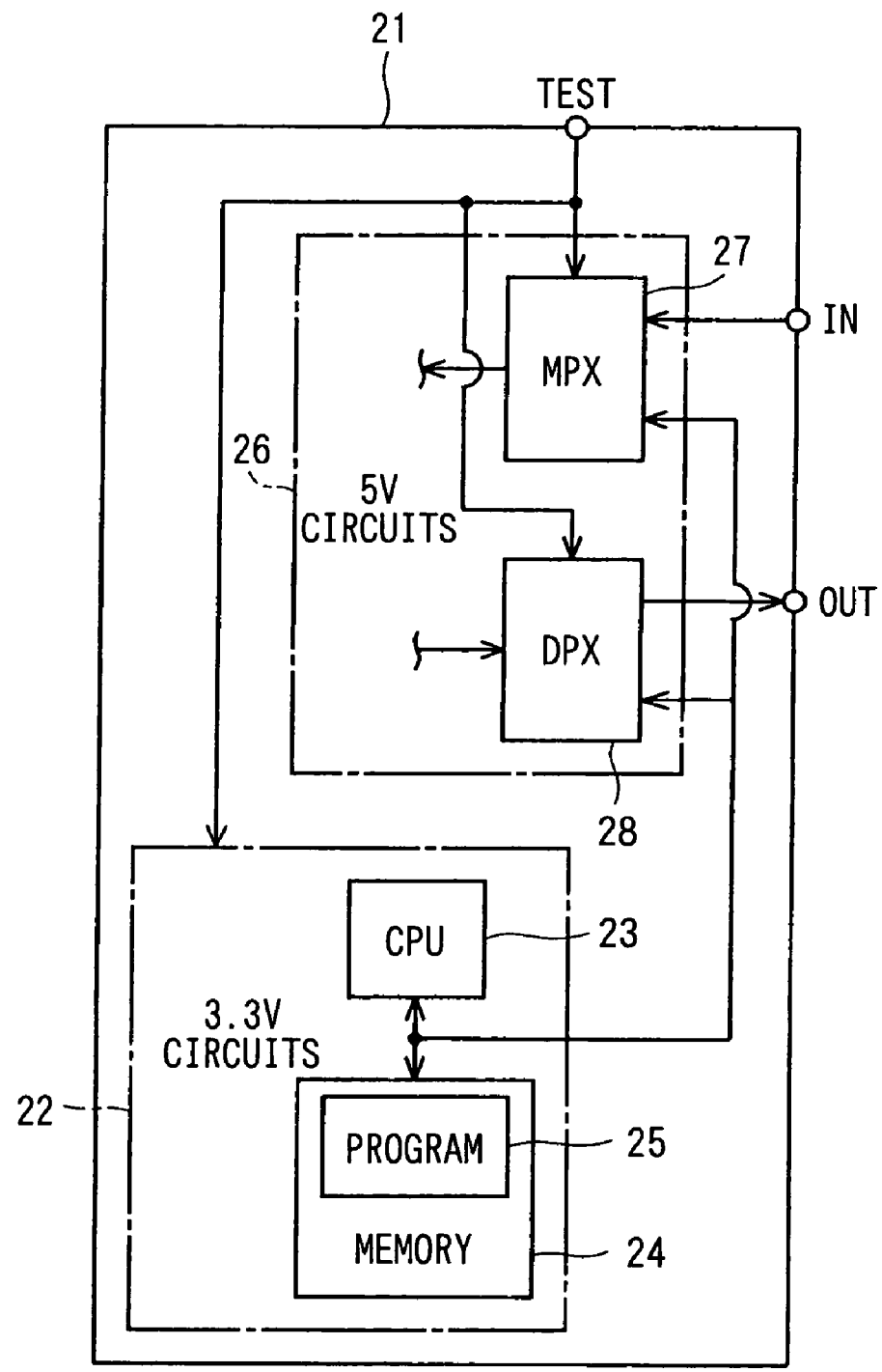
FIG. 3 is a circuit diagram showing a part of a microcomputer according to a second embodiment of the present invention.

In the second embodiment shown in FIG. 3, a one-chip microcomputer 21 has the same power supply systems as the microcomputer 1 of the first embodiment. The microcomputer 21 is equipped with a CPU 23 and a memory (storage section) 24 as parts of a 3.3V-type circuit section 22. A self-determination program (test program) 25 is stored in the memory 24.

External input signals are supplied, through a multiplexer (MPX) 27 for data bus switching, to a 5V-type circuit section 26 which is for input and output interface of signals to and from the outside. The 5V-type circuit section 26 voltage-converts input signals and outputs resulting signals to the 3.3V-type circuit section 22. On the other hand, signals that are output from the 3.3V-type circuit section 22 are voltage-converted by the 5V-type circuit section 26 and output to the outside through a demultiplexer (DPX) 28 for data bus switching 28.

One input terminal of the MPX 27 and one input terminal of the DPX 28 are connected to a testing data bus of a CPU 23. The testing data bus is a part, used only at the time of testing, of a general-purpose data bus.

The switching of the MPX 27 and the DPX 28 is made by setting the level of an external terminal TEST of the microcomputer 21. For example, in an ordinary mode in which the external terminal TEST is set to a low level, the MPX 27 and the DPX 28 are switched to external input terminals IN and external output terminals OUT, respectively. In a testing mode in which the external terminal TEST is set to a high level, both of the MPX 27 and the DPX 28 are switched to the testing data bus of the CPU 23. When the test mode is set, the CPU 23 reads the self-determination program 25 from the memory 24 and runs it.

Figure 4:
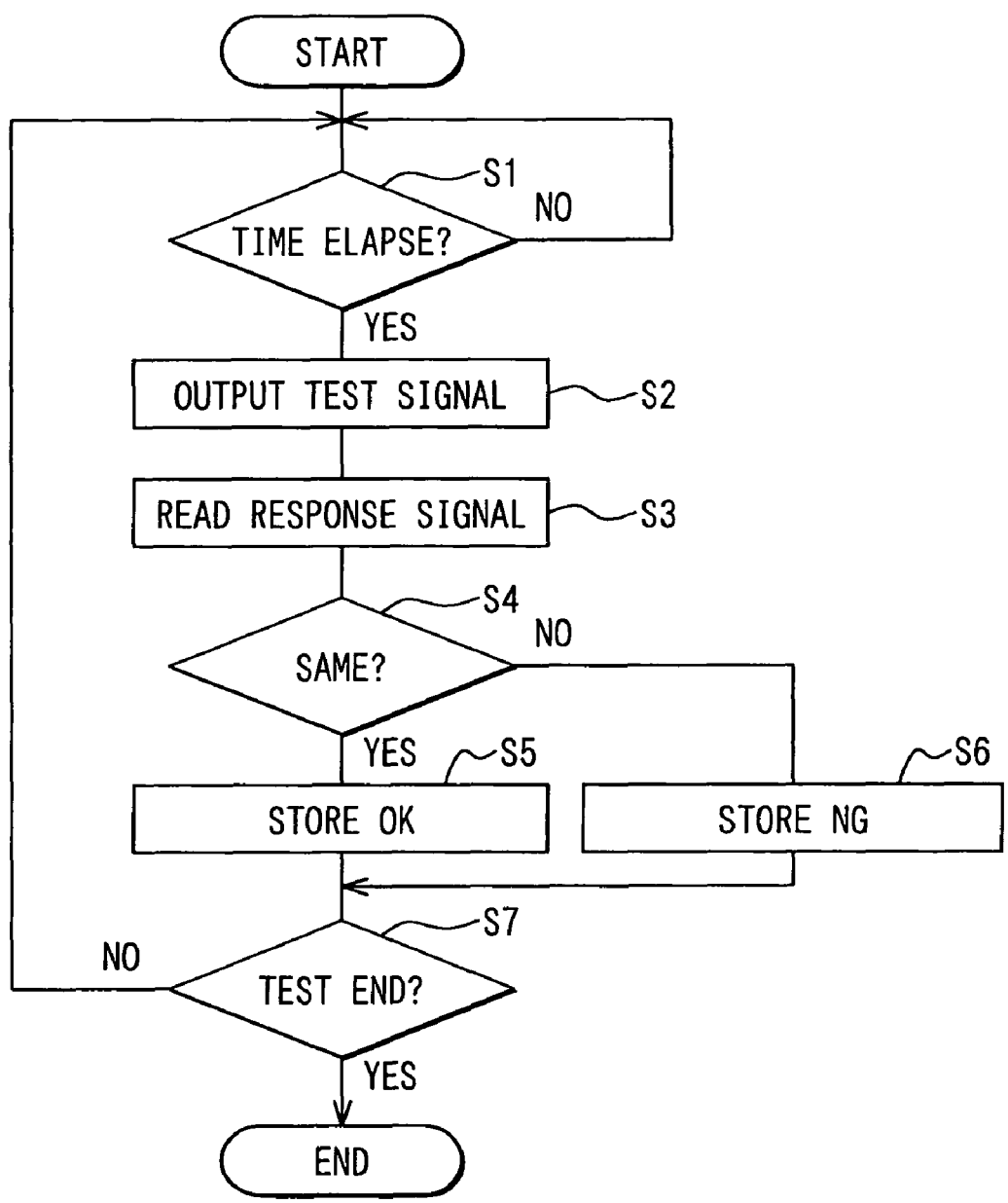
FIG. 4 is a flowchart showing a detailed self-determination program run by an on-chip CPU in the second embodiment.

FIG. 4 is a flowchart showing the details of a process of the self-determination program 25 that is run by the CPU 23, that is, the details of a monitored burn-in test. As in the case of the first embodiment, in the test mode, the voltage of 5V is supplied to the 3.3V-type circuit section 22 and the boosted voltage of the booster circuit 4 (FIG. 2) is supplied to the 5V-type circuit section 26. The testing environment temperature setting and the test time are the same as in the first embodiment.

When a prescribed time has elapsed (step S1: yes), the CPU 23 outputs a test signal to one of peripheral circuits that has been selected as a test subject and belongs to the 3.3V-type circuit section 22, via the MPX 27 (step S2). The CPU 23 reads, via the DPX 28, a response signal that is produced by the peripheral circuit in response to the test signal (e.g., result of prescribed logical operation on an input data value) (step S3). The CPU 23 then determines whether the data value of the response signal is the same as an expected value (step S4).

If coincidence (same) is found (step S4: yes), the CPU 23 writes and stores a determination result "OK" to the memory 24 (step S5). If non-coincidence is found (step S4: no), the CPU 23 writes and stores a determination result "NG" to the memory 24 (step S6). Then, the CPU 23 determines whether the test time set has elapsed (step S7). The CPU 23 returns to step S1 if the test time has not elapsed yet (step S7: no), and ends the process if the test time has elapsed (step S7: yes).

Since a test result is written and stored to the memory 24 every time the prescribed time elapses, one can know whether a result of the total burn-in test is "OK" or "NG" by outputting the contents of the memory 24 utilizing a serial communication function or the like of the microcomputer 21. The result of the total burn-in test is "OK" if all the individual test results are "OK," and it is "NG" if at least one individual test result is "NG."

As described above, in the second embodiment, when the test mode is set, the on-chip CPU 23 of the microcomputer 21 reads the self-determination program 25 from the memory 24 and runs it. Therefore, the microcomputer 21 can perform the burn-in test and determine a result thereof by itself. More specifically, the CPU 23 outputs test signals to the data bus that is connected to external input terminals IN every time the prescribed time elapses and determines the properness of response signals that are output from one of circuits belonging to the 3.3V-type circuit section 23 to which the test signals are supplied. Therefore, the properness of the circuit function can be checked at any time during the burn-in test.

The power supply systems of a microcomputer in the above embodiments may include only one of the 5V and 3.3V systems or three or more systems. In the latter case, when a test mode is set, switching is made so that each power supply voltage is supplied to a circuit section that is normally supplied with a one-step lower power supply voltage and the boosted voltage of the booster circuit is supplied to a circuit section that is normally supplied with the highest power supply voltage.

Where a plurality of power supply systems exist, booster circuits may be provided for the respective power supply systems. In this case, over-voltages that are most appropriate for respective circuit sections can be set.

Other methods for stopping operation of the booster circuit 4 are turning off an FET that is provided on the ground side of the resistor 12 and turning off an npn transistor that is provided between the output terminal of the operational amplifier 13 and the ground.

The booster circuit 4 may be configured so as to operate all the time while the microcomputer is supplied with power. The above configuration of the booster circuit 4 is just an example and may be in any form as long as proper over-voltages can be set.

Where the FET 14 can be controlled directly by the test mode setting level, the control logic section 15 is not necessary.

Each pair of switches 5 and 6 and switches 7 and 8 may be a single changeover switch.

The embodiments are not limited to the case of being applied to a dynamic burn-in test, but may also be applied to a static burn-in test.

In the second embodiment, the switching of the MPX 27 and the DPX 28 may be made by writing to a control register at the initial step when the CPU 23 starts running the self-determination program.

The form of monitored burn-in test is not limited to the one described in the second embodiment, and may be in any form as long as whether or not a function of a microcomputer is normal can be checked. For example, a standby leak current value or IDDQ (quiescent power supply current) may be measured by connecting a measuring circuit to a microcomputer.

Third Embodiment

Figure 5:
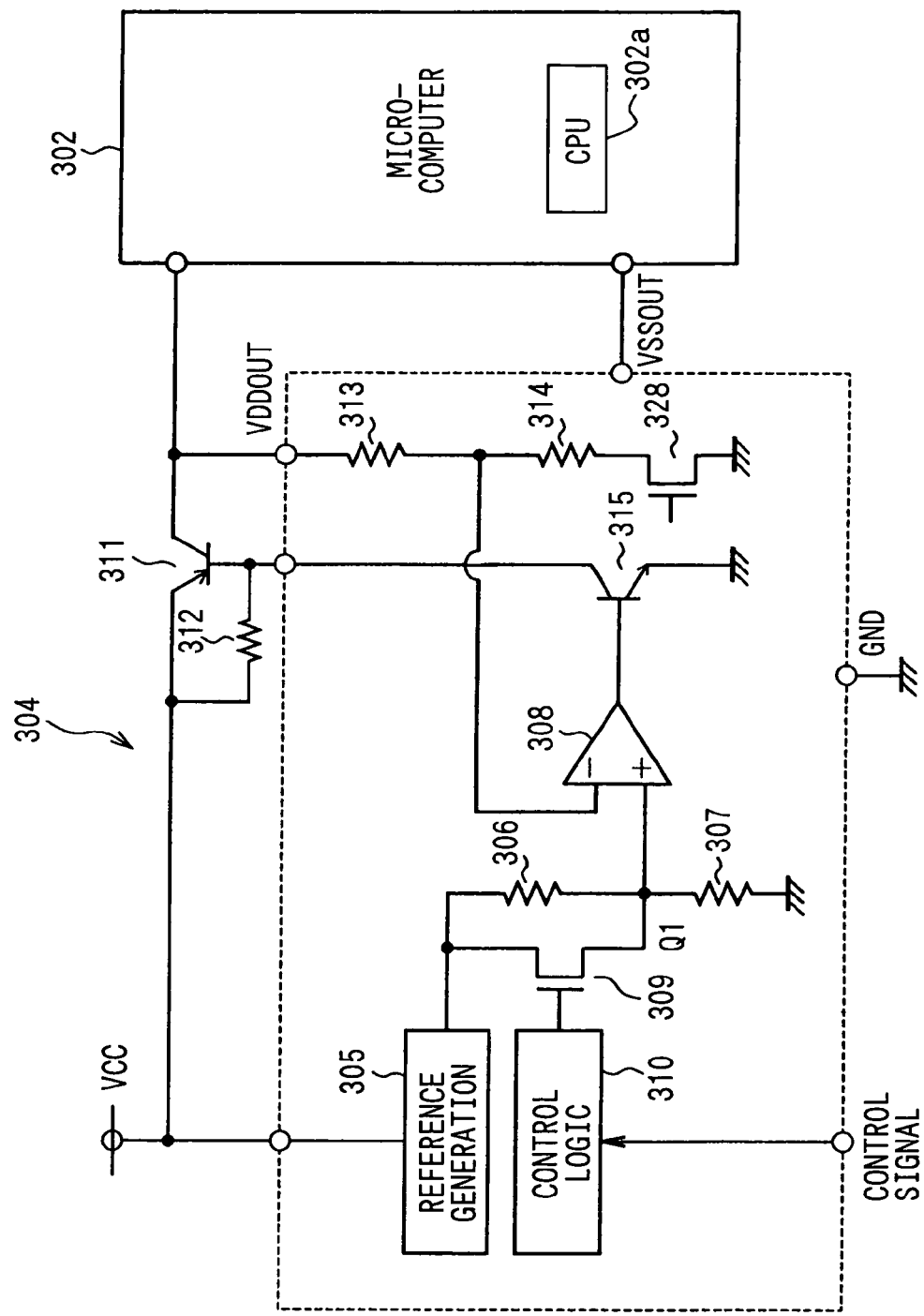
FIG. 5 is a circuit diagram showing an over-voltage application circuit of a microcomputer according to a third embodiment of the present invention.
Figure 6:
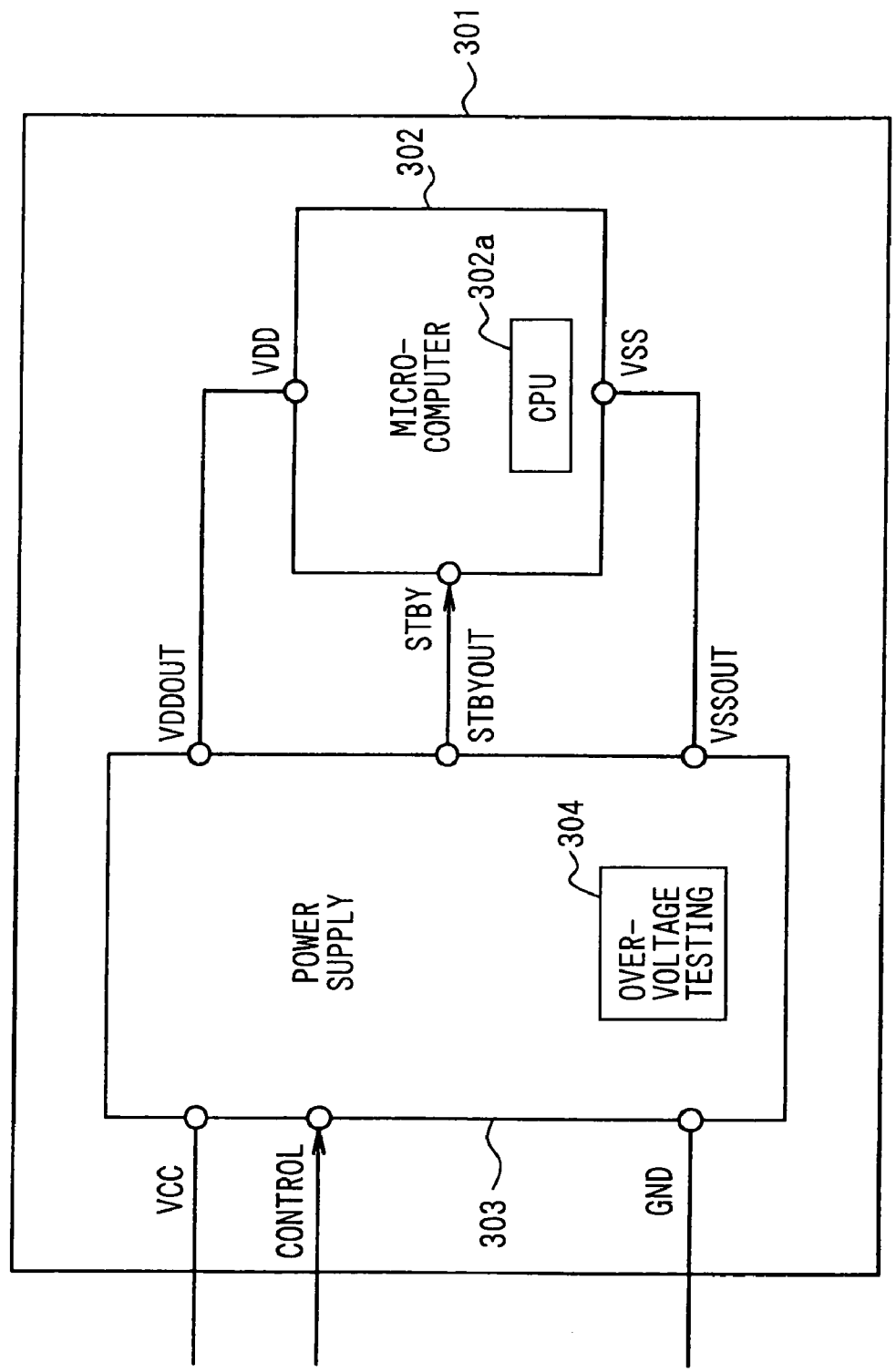
FIG. 6 is a circuit diagram showing a vehicular ECU having the microcomputer of the first embodiment and used as a semiconductor device.

A third embodiment is directed to a vehicular bare-chip-mounted ECU (electronic control unit) and shown in FIGS. 5 and 6. As shown in FIG. 6, an ECU (semiconductor device) 301 includes a microcomputer chip 302 having a CPU 302a that performs main computations of the ECU 301, a power supply IC chip (power supply circuit chip) 303 that supplies a power supply voltage VDD to the microcomputer chip 302, and chip components and printed components (not shown) that perform input/output and other kinds of processing.

The power supply IC chip 303 generates the power supply voltage VDD (e.g., 5V) on the basis of an externally supplied power supply voltage VCC and outputs it to the microcomputer chip 302. The power supply IC chip 303 outputs a standby signal STBY to the microcomputer chip 302 in response to an externally supplied control signal. When receiving a standby signal STBY, the microcomputer chip 302 stops its circuit operation.

FIG. 5 shows an over-voltage application testing circuit 304 that is incorporated in the power supply IC chip 303 as a booster circuit. A reference voltage generation section 305 receives the power supply voltage VCC and generates and output a reference voltage. The output terminal of the reference voltage generation section 305 is grounded via a series circuit of resistors 306 and 307. The junction of the resistors 306 and 307 is connected to the non-inverting input terminal of an operational amplifier 308. A p-channel MOSFET 309 is connected in parallel to the resistor 306. The gate of the FET 309 is connected to a control signal input terminal via a control logic section 310.

The emitter of a pnp transistor 311 is connected to the voltage source VCC and connected to its base via a resistor 312. The collector of the transistor 311 is grounded via a series circuit of resistors 313 and 314 and an n-channel MOSFET 328. The base of the transistor 311 is connected to the collector of an npn transistor 315.

The junction of the resistors 313 and 314 is connected to the inverting input terminal of the operational amplifier 308. The output terminal of the operational amplifier 308 is connected to the base of the transistor 315. The emitter of the transistor 315 is grounded. The collector of the transistor 311 is connected to an output terminal VDDOUT for output of the power supply voltage VDD to the microcomputer chip 302.

In this embodiment, to cause the microcomputer chip 302 to operate normally in an ordinary mode, the control signal is set to a low level (inactive). At this time, the control logic section 310 turns off the FET 309, whereby a divided potential of the resistors 306 and 307 is applied to the non-inverting input terminal of the operational amplifier 308. The FET 328 is set on to keep the over-voltage application circuit 304 operational in this embodiment.

Therefore, the FET 328 may be omitted in the case where only the over-voltage application circuit 304 is rendered operational. The operational amplifier 308 keeps the transistor 315 in the on-state by outputting a signal corresponding to the difference between the above divided potential and a divided potential applied to its inverting input terminal.

Since the transistor 315 allows its collector current to flow in accordance with its base current, the current that flows from the voltage source VCC to the collector side of the transistor 311 past the transistor 311 is determined by the collector current of the transistor 315. Setting are made so that the collector potential of the transistor 311 becomes 5V in the above state.

To perform a burn-in test on the ECU 301, the microcomputer chip 302 being supplied with a higher power supply voltage than in the ordinary state is placed in a high temperature atmosphere (e.g., 125° C.) in a thermostatic chamber in a state that the microcomputer chip 302 is kept operating for about 20 hours, for example.

When the control signal is set to a high level (active) on each prescribed occasion, the control logic section 310 turns on the FET 309 by making its gate at a low level. The resistor 306 is short-circuited and hence the reference voltage itself generated by the reference voltage generation circuit 305 is applied to the non-inverting input terminal of the operational amplifier 308.

As a result, the difference between the potentials of the inverting and non-inverting input terminals increases, whereby the output signal level of the operational amplifier 308 and hence the collector current of the transistor 311 are increased. Settings are made so that the collector potential of the transistor 311 is increased to 6 to 7 V in this state. A burn-in test is performed in the state that an over-voltage of 6 to 7 V is applied to the microcomputer chip 302. The kind of the burn-in test may be any of static, dynamic, and monitored.

As described above, according to the third embodiment, circuit elements forming the microcomputer chip 302 can be tested while over-voltage stress is imposed thereon, because the power supply IC chip 303 for supplying an operation power supply voltage to the microcomputer chip 302 mounted on the same integrated circuit substrate is equipped with the over-voltage application circuit 304 for boosting the operation power supply voltage VDD.

Since unlike in the conventional case it is not necessary to conduct tests by performing probing on each microcomputer bare chip, a burn-in test can be performed easily on bare chips. The cost and time that are required for tests can be reduced to a large extent.

Fourth Embodiment

Figure 7:
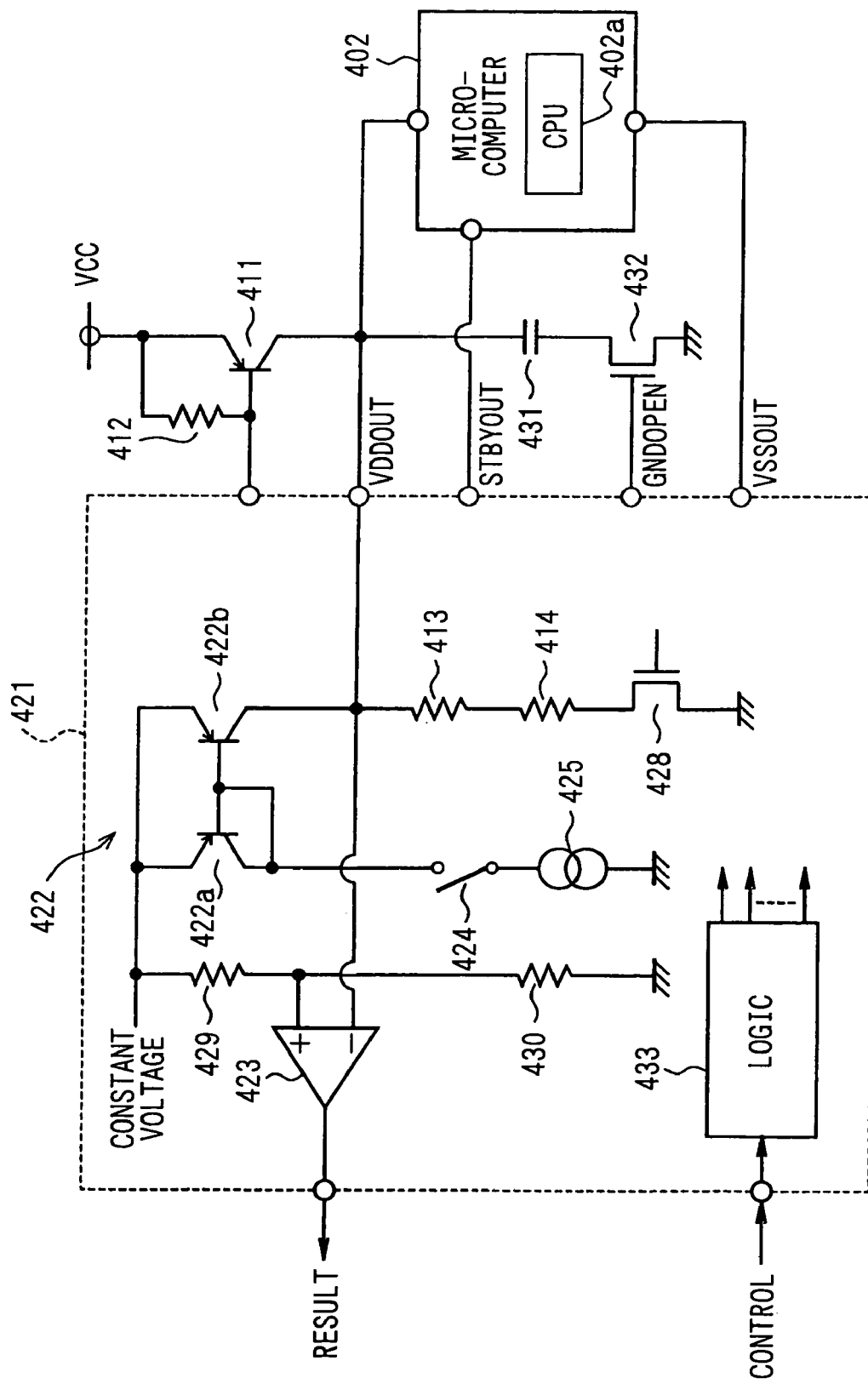
FIG. 7 is a circuit diagram showing a standby leak determination circuit of a microcomputer according to a fourth embodiment of the present invention.

In a fourth embodiment, as shown in FIG. 7, a standby leak determination circuit 421 is incorporated in the power supply IC chip. The standby leak determination circuit (testing circuit) 421 is mainly composed of a current mirror circuit 422 and a comparator 423.

The current mirror circuit 422 includes pnp transistors 422*a* and 422*b*, the emitters of which are connected to a constant voltage source (constant voltage circuit). The bases of the transistors 422*a* and 422*b* are connected to the collector of the transistor 422*a*. The collector of the transistor 422*a* is grounded via a switch 424 and a current source 425.

On the other hand, the collector of the transistor 422*b* is grounded via a series circuit of resistors 413 and 414 and an n-channel FET 428, and connected to the collector of a transistor 411 and the inverting input terminal of the comparator 423.

A series circuit of resistors 429 and 430 is provided between the constant voltage source and the ground. The non-inverting input terminal of the comparator 423 is connected to the junction of the resistors 429 and 430. A signal indicating a determination result of a standby leak current is output from the output terminal of the comparator 423.

A bypass capacitor 431 is connected to the power supply terminal of a microcomputer chip 402 having a CPU 402*a*. The ground-side terminal of the capacitor 431 is grounded via an n-channel FET 432. Where an element, other than the capacitor 431, for causing a current flow to the ground is externally connected to the microcomputer chip 402, an FET should be provided on the ground side of the element.

The leak determination circuit 421 is equipped with a determination control logic section 433, which on/off-controls the switch 424 and the FETs 428 and 432 in accordance with an externally supplied determination control signal.

During an ordinary operation, controls are made so as to turn off the switch 424 and turn on the FETs 428 and 432. The switch 424 for turning on or off the current source 425 may be an analog switch, for example. Another specific example of the combination of the switch 424 and the current source 425 is such that a current mirror circuit including a pair of npn transistors is provided on the ground side and turned on or off by controlling the base of one of the npn transistors.

In the fourth embodiment, when the externally supplied determination control signal turns active, the determination control logic section 433 controls individual sections and elements in the following manner.

(1) Microcomputer Chip 402: Standby

The logic section 433 renders the microcomputer chip 402 in a standby mode by outputting a standby signal STBY to it.

(2) Transistor 411: Off

The logic section 433 stops supplying the power supply voltage VDD to the microcomputer chip 402.

One method for stopping supply of the power supply voltage VDD to the microcomputer chip 402 is to add the following elements to the over-voltage application circuit 404 shown in FIG. 5 and performing the following controls:

(2a) connecting an FET in parallel to the resistor 307 and turning on the FET;

(2b) inserting an FET between the resistor 307 and the ground and turning off the FET. It is desirable to disconnect the leak current path of item (2a);

(2c) providing an npn transistor between the output terminal of the operational amplifier 308 and the ground and turning on the transistor.

(3) FETs 428 and 432: Off

The logic section 433 separates the resistors (output feedback resistors) 413 and 414, the bypass capacitor 431, etc. from the ground.

(4) Switch 424: on

The logic section causes the current mirror circuit 422 to operate and supplies a constant current corresponding to a leak determination value to the microcomputer chip 402 via the transistor 422*b*.

With the above settings, the potential of the VDDOUT terminal decreases if the leak current in the microcomputer chip 402 exceeds the current that is supplied from the current mirror circuit 422. Therefore, if the potential of the VDDOUT terminal becomes lower than the potential of the non-inverting input terminal of the comparator 423, the comparator 423 outputs a high-level signal, which means that the determination result is "NG."

For example, the above standby leak current determination is performed after a burn-in test has been performed by applying an over-voltage to the microcomputer chip 402 by the over-voltage application circuit 404. Alternatively, the standby leak current determination may be performed at proper intervals during a burn-in test.

As described above, according to the fourth embodiment, since the standby leak determination circuit 421 is provided in the power supply IC chip 303, it can be checked, by determining the magnitude of the standby leak current, whether the functions of individual elements are normal or not even after over-voltage stress has been imposed on the microcomputer chip 402.

Fifth Embodiment

Figure 8:
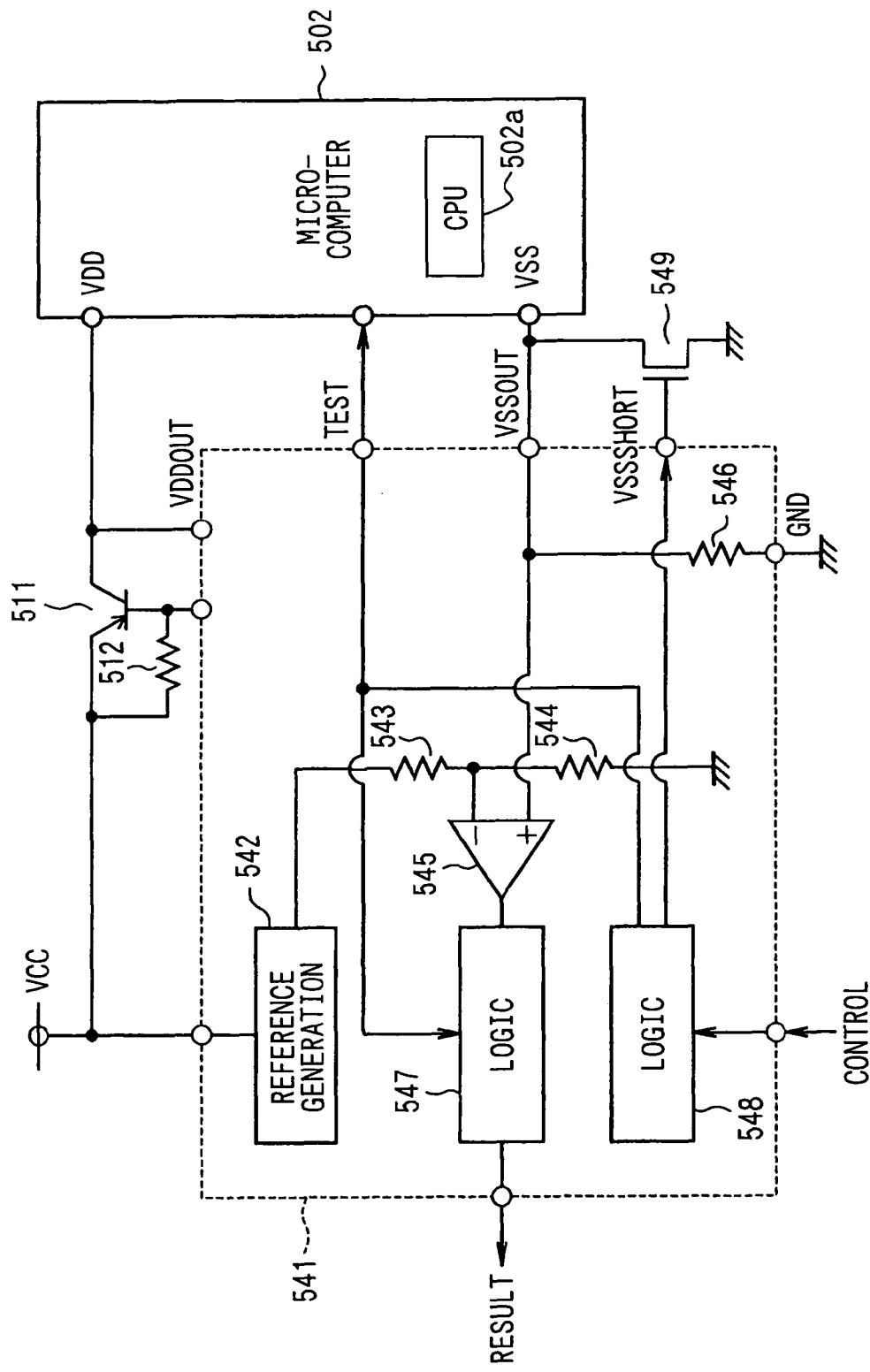
FIG. 8 is a circuit diagram showing a IDDQ measurement circuit of a microcomputer according to a fifth embodiment of the present invention.

In a fifth embodiment shown in FIG. 8, an IDDQ (quiescent power supply current) measurement circuit (testing circuit) 541 is incorporated in the power supply IC chip. A reference voltage generation section 542 receives a power supply voltage VCC and generates and outputs a reference voltage. The output terminal of the reference voltage generation section 542 is grounded via a series circuit of resistors 543 and 544. The junction of the resistors 543 and 544 is connected to the inverting input terminal of a comparator 545.

The non-inverting input terminal of the comparator 545 is grounded via a resistor 546 and connected to a ground terminal VSS of a microcomputer chip 502 having a CPU 502a. The output terminal of the comparator 545 is connected to the input terminal of a determination logic section 547. A test signal that is output from a measurement control logic section 548 is supplied to the determination logic section 547. The determination logic section 547 outputs a signal indicating a determination result of an IDDQ measurement to the outside on the basis of a received signal.

When an externally supplied measurement control signal turns active, the measurement control logic section 548 outputs a test signal to the microcomputer chip 502 and the determination logic section 547. An n-channel MOSFET 549 is provided between the ground terminal VSS of the microcomputer chip 502 and the ground. The measurement control logic section 548 outputs a gate signal to the gate of the FET 549. The FET 549 is controlled so as to be kept on while the microcomputer chip 502 is in an ordinary operation.

When the externally supplied measurement control signal turns active, the measurement control logic section 548 turns off the FET 549. The measurement control logic section 548 outputs a test signal to the microcomputer chip 502 to cause it to operate. A current that is consumed by the operation of the microcomputer chip 502 is converted to a voltage by the resistor 546.

The comparator 545 compares the divided voltage of the resistors 543 and 544 with the terminal voltage of the resistor 546. If the consumption current has an abnormally large value because of a defect or the like in an internal circuit of the microcomputer chip 502, the terminal voltage of the resistor 546 increases to a large extent. In this case, the output signal level of the comparator 545 is reversed from "low" to "high."

The determination logic section 547 refers to the output signal of the comparator 545 in synchronism with the output timing of the test signal. If the output signal level of the comparator 545 is "high" during periods when the test signal level does not vary, the determination logic section 547 outputs a signal indicating a determination result "NG" to the outside.

As in the case of the standby leak determination of the fourth embodiment, this IDDQ measurement may be performed after a burn-in test has been performed by applying an over-voltage to the microcomputer chip by an over-voltage application circuit or performed at proper intervals during a burn-in test.

As described above, according to the fifth embodiment, since the IDDQ measurement circuit 541 is provided in the power supply IC chip 503, it can be checked, by measuring a quiescent power supply current, whether the functions of individual elements are normal or not even after over-voltage stress has been imposed on the microcomputer chip 502.

In the third to fifth embodiments, the testing circuit may be any circuit as long as it imposes over-voltage stress on elements constituting a microcomputer chip or a circuit for determining the states of the elements after the stress has been imposed thereon. The circuit for imposing stress on elements of a microcomputer chip may be a circuit for imposing thermal stress or electrostatic stress.

The standby leak determination circuit or the IDDQ measurement circuit need not always be provided; that is, the states of elements may be determined by performing a monitored burn-in test.

Although in the embodiments the semiconductor devices are ones formed by a Bi-CMOS or Bi-CDMOS process, they may be formed by a CMOS or bipolar process.

Further modifications and alteration of the above embodiments are also possible without departing from the spirit of the invention.

What is claimed is:

1. A semiconductor device comprising:
    a one-chip microcomputer including therein a booster circuit for boosting an externally supplied power supply voltage, the booster circuit being incorporated in a same chip of the microcomputer, wherein
    the microcomputer is configured so that an over-voltage application testing can be performed thereon by using a boosted voltage of the booster circuit, and
    the microcomputer includes:
    a plurality of voltage input terminals for receiving different power supply voltages;
    a plurality of circuit sections that operate with the power supply voltages via the plurality of voltage input terminals, respectively; and
    voltage switching means for switching so that the boosted voltage of the booster circuit is supplied to one of the plurality of circuit sections that normally operates with a highest one of the power supply voltages in an ordinary state and that each of the other circuit sections is supplied with a one-step higher voltage than a voltage that it is normally supplied in the ordinary state.

2. The semiconductor device according to claim 1, wherein the booster circuit operates only while the over-voltage application testing is performed.

3. The semiconductor device according to claim 1, wherein the microcomputer includes:
    a storage section for storing a test program to be run to perform the over-voltage application testing; and
    a CPU for reading the test program from the storage section, running the test program to perform the over-voltage application and determining a result of the over-voltage application testing.

4. The semiconductor device according to claim 3, wherein the microcomputer further includes data bus switching means for switching so that a data bus connected to external signal input terminals and a data bus connected to external signal output terminals are connected to a data bus of the CPU.

5. The semiconductor device according to claim 4, wherein the CPU outputs test signals to the data bus every time a prescribed time elapses and determines properness of response signals that are output from a circuit section in response to the test signals, by running the test program.

6. The semiconductor device according to claim 3, wherein the storage section stores the result of the over-voltage application testing determined by the CPU.

7. An over-voltage application testing method for a one-chip microcomputer that has a booster circuit therein for boosting an externally supplied power supply voltage, a plurality of voltage input terminals for receiving different power supply voltages, and a plurality of circuit sections that operate with the power supply voltages via the plurality of voltage input terminals, respectively, the method comprising the steps of:
  switching so that the boosted voltage of the booster circuit is supplied to one of the plurality of circuit sections that normally operates with a highest one of the power supply voltages in an ordinary state and that each of the other circuit sections is supplied with a one-step higher voltage than a voltage that it is normally supplied in the ordinary state; and
  performing an over-voltage application testing on the microcomputer with the boosted voltage and the one-step higher voltage.

8. The over-voltage application testing method according to claim 7 further comprising the step of:
  switching so that a data bus connected to external signal input terminals and a data bus connected to external signal output terminals are connected to a data bus of a CPU of the microcomputer; and
  causing the CPU to output test signals to the data bus every time a prescribed time elapses and to determine properness of response signals that are output from a circuit section in response to the test signals.

9. The over-voltage application testing method according to claim 8 further comprising the step of:
  storing a result of determination of the CPU in a memory of the microcomputer.

10. A semiconductor device comprising:
  a microcomputer chip; and
  a power supply circuit chip, mounted on a same integrated circuit substrate as the microcomputer chip, for generating an operation power supply voltage to be supplied to the microcomputer chip, the power supply circuit chip including a testing circuit for performing a function test on elements forming the microcomputer chip in a state that stress is imposed on the elements, wherein
  the testing circuit is for performing a standby leak determination.

11. The semiconductor device according to claim 10, wherein the testing circuit is an over-voltage application circuit for boosting, when the function test is performed, the operation power supply voltage to an over-voltage higher than a voltage normally applied to the microcomputer.

12. A semiconductor device comprising:
  a one-chip microcomputer including therein a booster circuit for boosting an externally supplied power supply voltage, the booster circuit being incorporated in a same chip of the microcomputer, wherein
  the microcomputer is configured so that an over-voltage application testing can be performed thereon by using a boosted voltage of the booster circuit, and includes:
    a storage section for storing a test program to be run to perform the over-voltage application testing;
    a CPU for reading the test program from the storage section, running the test program to perform the over-voltage application and determining a result of the over-voltage application testing; and
    data bus switching means for switching so that a data bus connected to external signal input terminals and a data bus connected to external signal output terminals are connected to a data bus of the CPU;
    the CPU outputting test signals to the data bus every time a prescribed time elapses and determining appropriateness of response signals that are output from a circuit section in response to the test signals by running the test program.

13. A semiconductor device comprising:
  a microcomputer chip; and
  a power supply circuit chip, mounted on a same integrated circuit substrate as the microcomputer chip, for generating an operation power supply voltage to be supplied to the microcomputer chip, the power supply circuit chip including a testing circuit for performing a function test on elements forming the microcomputer chip in a state that stress is imposed on the elements,
  wherein the testing circuit is for measuring a quiescent power supply current.

14. The semiconductor device according to claim 13, wherein the testing circuit is an over-voltage application circuit for boosting, when the function test is performed, the operation power supply voltage to an over-voltage higher than a voltage normally applied to the microcomputer.

* * * * *